(12) United States Patent
Hennig

(10) Patent No.: US 7,106,060 B2
(45) Date of Patent: Sep. 12, 2006

(54) METHOD FOR MEASURING THE NUCLEAR MAGNETIC RESONANCE (NMR) OF SUBSTANCES HAVING HYPERPOLARIZED NUCLEI USING CONTINUOUSLY REFOCUSED MULTIECHO SPECTROSCOPIC IMAGING

(75) Inventor: Juergen Hennig, Freiburg (DE)

(73) Assignee: Universitätsklinikum Freiburg, Freiburg (DE)

( * ) Notice: Subject to any disclaimer, the term of this patent is extended or adjusted under 35 U.S.C. 154(b) by 0 days.

(21) Appl. No.: 11/076,554

(22) Filed: Mar. 9, 2005

(65) Prior Publication Data

US 2005/0200356 A1    Sep. 15, 2005

(30) Foreign Application Priority Data

Mar. 11, 2004   (DE) ................ 10 2004 011 874

(51) Int. Cl.
*G01V 3/00*    (2006.01)
(52) U.S. Cl. ...................... 324/309; 324/307
(58) Field of Classification Search ............... 324/309, 324/307, 318, 319, 322, 300; 600/410
See application file for complete search history.

(56) References Cited

U.S. PATENT DOCUMENTS

| | | | |
|---|---|---|---|
| 4,896,113 A | | 1/1990 | Pelc |
| 5,270,654 A | * | 12/1993 | Feinberg et al. ............ 324/309 |
| 5,404,882 A | * | 4/1995 | Santyr ........................ 600/410 |
| 5,779,636 A | | 7/1998 | Kanazawa et al. |
| 6,404,195 B1 | | 6/2002 | Deimling |
| 6,456,071 B1 | | 9/2002 | Hennig |
| 6,873,153 B1 | * | 3/2005 | Frydman ................... 324/307 |
| 6,919,721 B1 | * | 7/2005 | Bottcher et al. ............ 324/307 |

FOREIGN PATENT DOCUMENTS

| | | |
|---|---|---|
| DE | 199 31 292 C2 | 2/2001 |
| DE | 100 35 319 C2 | 2/2002 |

OTHER PUBLICATIONS

H.Y. Carr, "Steady-State Free Precession in Nuclear Magnetic Resonance", Phys. Rev. 112, 1693 (1958).
Daniel A. Herzka, et al., Multishot EPI-SSFP in the Heart, Magnetic Resonance in Medicine, 47:655-664 (2002), Wiley-Liss, Inc.

(Continued)

Primary Examiner—Brij B. Shrivastav
(74) Attorney, Agent, or Firm—Walter A. Hackler

(57) ABSTRACT

A nuclear magnetic resonance (NMR) method for spatially resolved measurement of the distribution of signals of metabolites of different resonance frequencies by application of a sequence of radio-frequency pulses and switched magnetic fields, wherein the generated signals are generated by application of read gradients in a spatially encoded manner in the direction of these gradients, is characterized in that, after a time interval TR/2, the initially excited magnetization is subjected to a sequence of several radio frequency pulses, which are equally spaced by time intervals TR, and the used magnetic field gradients in each TR interval are applied such that the originally excited magnetization is repeatedly refocused in several TR intervals and thereby read out several times, several signals are generated within one TR interval by multiple inversion of the read gradient, and the signals which are read-out several times are each identically spatially encoded by application of phase encoding gradients and therefore differ only with respect to dephasing given by the respective resonance frequency, such that the individual signals at any read-out time can subsequently be associated with the signal contributions of the examined substances of different resonance frequencies. This method permits chemical shift selective measurement of hyperpolarized metabolites.

19 Claims, 6 Drawing Sheets

OTHER PUBLICATIONS

David A. Feinberg, et al., "Dual Contrast Grase (Gradient-Spin Echo) Imaging Using Mixed Bandwidth", Magnetic Resonance in Medicine, 31:461-464 (1994), Williams & Wilkins.

Shantanu Sarkar, et al., "Applications of High-Resolution Echoplanar Spectroscopic Imaging for Structural Imaging", Journal of Magnetic Resonance Imaging, 10:1-7 (1999), Wiley-Liss, Inc.

Scott B. Reeder, et al., "Multicoil Dixon Chemical Species Separation With an Iterative Least-Squares Estimation Method", Magnetic Resonance in Medicine, 51:35-45 (2004), Wiley-Liss, Inc.

David A. Feinberg, et al., "Echo-Planar Imaging With Asymmetric Gradient Modulation and Inner-Volume Excitation", Magnetic Resonance in Medicine, 13, 162-169 (1990), Academic Press, Inc.

Juergen Hennig, et al., "Multiecho Sequences With Variable Refocusing Flip Angles: Optimization of Signal Behavior Using Smooth Transitions Between Pseudo Steady States (Traps)", Magnetic Resonance in Medicine, 4:-527-535 (2003), Wiley-Liss, Inc.

Juergen Hennig, et al., "Optimization of Signal Behavior in the Transition to Driven Equilibrium in Steady-State Free Precession Sequences", Magnetic Resonance in Medicine, 48:801-809 (2002), Wiley-Liss, Inc.

Juergen Hennig and Klaus Scheffler, "Hyperechoes", Magnetic Resonance in Medicine, 46:6-12 (2001), Wiley-Liss, Inc.

W. Dreher, D. Leibfritz: "A new method for fast proton spectroscopic imaging: spectroscopic case" Magnetic resonance in medicine, vol. 44, Nov. 2000, pp. 668-672, XP000969761 ISSN: 0740-3194 *p. 668-670: "Abstract"—end of "Materials and Methods"* *Figs. 1 and 3 *.

K. Oshio, D.A. Feinberg: "Single-Shot grase imaging without fast gradients"Magnetic resonance in medicine, vol. 26, Aug. 1, 1992, pp. 355-360, XP000294183, ISSN: 0740-3194 * the whole document*.

* cited by examiner

METHOD FOR MEASURING THE NUCLEAR MAGNETIC RESONANCE (NMR) OF SUBSTANCES HAVING HYPERPOLARIZED NUCLEI USING CONTINUOUSLY REFOCUSED MULTIECHO SPECTROSCOPIC IMAGING

The invention concerns a nuclear magnetic resonance (NMR) method for spatially resolved measurement of the distribution of signals of metabolites of different resonance frequencies by application of a sequence of radio frequency pulses and switched magnetic fields, wherein the generated signals are generated by application of read gradients in a spatially encoded manner in the direction of these gradients.

BACKGROUND OF THE INVENTION

In the last couple of years, a series of techniques were developed which permit preparation of nuclei having a magnetic moment such that the population of the individual nuclear spin states differs to some extent substantially from the equilibrium state produced by the Boltzmann distribution. The associated changed population difference can be converted in an NMR experiment into a considerable increase of the signal intensity by factors of up to several thousand (so-called hyperpolarization). Conventional methods to obtain such hyperpolarization are based e.g. on the hyperpolarization of inert gases mediated through optical transitions, polarization-mediated through electron spin transitions of suitable radicals (dynamic nuclear polarization=DNP), via chemical reactions with spin-ordered substances (para-hydrogen polarization=PHP) or also thermal polarization at extremely low temperatures in extremely high magnetic fields. Mainly the three last-mentioned methods are particularly promising since they allow for polarization of a large number of substances which are also of medical-biological relevance.

Due to the deviation of the population differences from the equilibrium state, the lifetime of the generated hyperpolarization is limited, the polarized spin system will relax to the thermal equilibrium with the relaxation constant T1. For this reason, substances having long T1 constants are preferably used for such experiments. Corresponding experiments were initially carried out using inert gases which are easy to polarize and comprise very long T1 times. For DNP and PHP hyperpolarization, substances with C13 marked nuclei have been mainly used recently at suitable binding locations, wherein the above-mentioned principles of hyperpolarization may also be applied to other nuclei.

To measure NMR signals of such substances, it must be observed that the once-prepared magnetization which is originally present as z-magnetization, must be transferred into transverse magnetization for signal read-out, and subsequently decays to the equilibrium state at the transverse relaxation time T2 which is generally much faster. Magnetization excited through a 90° pulse is therefore available only once for read-out, such that many conventional NMR spectroscopy or MR imaging measurement methods are not suitable for application with hyperpolarized substances. Consequently, so-called gradient echo sequences with small flip angles are used for imaging experiments with corresponding substances, wherein with each excitation only a very small part of the polarized magnetization is read-out. Modified steady state sequences have recently also been used, in particular for 13C polarized substances, which permit multiple read-outs of the hyperpolarization through spin-echo formation when large flip angles (180°) are used after an initial 90° pulse, thereby providing maximum signal yield.

A particularly interesting and promising field of application of hyperpolarization measurement is the observation of the metabolic conversion of polarized substances. One can show e.g. that after venous injection of pyruvate a metabolic conversion to lactate and alanine is produced. The local metabolic rate, a parameter which is very important in particular in the diagnosis of cancer, can be determined through measurement of the lactate signal.

A precondition of the measurement is thereby the separate measurement of the signals of lactate, alanine and pyruvate, wherein preferably images corresponding to the spatial distribution of the metabolites are generated. In accordance with prior art, the spatial distribution of metabolites can be represented using so-called chemical shift imaging (CSI) techniques. One problem of these techniques is, however, that they considerably increase the measuring time: To record an image without chemical-shift encoding of a matrix size of n1×n2 image elements (pixels), n2 recording steps are sufficient since the first dimension of an image can be recorded in one recording step when the signal is read-out using a local encoding gradient. For a CSI experiment with a recording of s1 points in the direction of the spectroscopic dimension, n2×s1 recording steps are required, wherein s1 is in general in the range 8<s1<128. The total number of recording steps thereby increases by a factor s1. In case the number of recording steps is limited due to the lifetime of the polarized spins, the spatial resolution is correspondingly reduced by a factor s1.

As an alternative to a CSI experiment, chemical shift selective imaging (CSSI) methods may be carried out, wherein the chemical shift is selected through corresponding chemical shift selective preparation either of the signal phase or of the signal amplitude, and the signals are subsequently recorded using conventional imaging sequences. The most frequently used CHESS imaging method is, however, not suited for the inventive object, since the signal of one of the concerned metabolites is thereby suppressed and only the second is read-out while mapping of the metabolic conversion always requires recording of both (or more) metabolites.

DETAILED DESCRIPTION OF THE INVENTIVE METHOD

In contrast thereto, it is the object of the present invention to modify a method comprising the above-described features with minimum expense to permit performance of a chemical shift selective measurement of hyperpolarized metabolites.

SUMMARY OF THE INVENTION

In accordance with the invention, this object is achieved in that after a time interval TR/2, the initially excited magnetization is subjected to a sequence of several radio frequency pulses, which are equally spaced by time intervals TR, and the used magnetic field gradients in each TR interval are applied such that the originally excited magnetization is repeatedly refocused in several TR intervals and is thereby multiply read-out, and also several signals are generated within a TR interval by multiple inversion of the read gradient, and the multiply read-out signals are each identically spatially encoded by application of phase encoding gradients and therefore differ only with respect to dephasing produced by the respective resonance frequency such that, at any read-out time, the individual signals can subsequently be associated with the signal contributions of the examined substances of different resonance frequencies.

With particular preference, the examined spins are prepared in a state far away from equilibrium magnetization ("hyperpolarization") and can therefore be used only once for excitation.

On the one hand, recording methods are used which apply measuring sequences, wherein the once excited magnetization is read out several times through application of corresponding refocusing pulses and magnetic field gradients by spatial encoding using magnetic field gradients.

Several signals are read-out in each refocusing interval (=time between two radio frequency pulses), the signals being identically encoded relative to the spatial encoding effected by magnetic field gradients, wherein the signals of different metabolites each differ by a characteristic behavior of the respective signal phase, and the individual signals of the observed metabolites can be separated through corresponding algorithms.

The reference between the inventive method and prior art is described below:

To generate signals, sequences are used which are known as SSFP sequence (1), multi-echo SSFP sequence (2), GRASE sequence (3). The concept of encoding the chemical shift through multiple read-outs of the signals through multiple gradient reversal is described in (4) for many signals with subsequent separation through Fourier transformation, (5) describes separation of signals at different read-out times through solution of a corresponding linear equation system. (6) finally shows the basic principle of unipolar read-out and (7) through (9) are variants of signal generation for optimizing the signal yield through variation of the flip angle.

The basic scheme of the sequence resulting from a combination of these features is shown in FIG. 1. RF thereby characterizes the radio frequency pulses and signals, GS the slice selection gradient, GR the read gradient and GP the phase encoding gradient. The spin ensemble respectively selected for signalling is chosen through corresponding selection of the individual gradient pulses. For R1=0 and R2+R3+R4+R5+R6=0 and complete rephasing of the corresponding slice gradients, a completely refocused (VR) sequence relative to the gradient scheme is obtained (FIG. 2A). If all flip angles of the measuring sequence repeated at a time interval TR are close to 180°, the entire magnetization will thereby be present as transverse magnetization and will be correspondingly refocused. For R1=R3, R2=R3/2 and R2+R3+R4+R5+R6=2R1 with corresponding slice selection gradients, a spin-echo (SE) sequence is obtained (FIG. 2B) wherein, with α~180°, also mainly transverse magnetization is formed which can be read-out as spin echo. Application to substances with T2<<T1 is particularly favorable since the signal decay is correspondingly slowed down. Differences between the VR and SE sequence are generated in that the SE sequence causes complete refocusing of all spins, whereas the VR sequence may comprise signal attenuation corresponding to the off-resonance frequency. With respect to the phases of the radio frequency pulses, the phase $\phi$ for the VR sequence is alternated in subsequent TR intervals between 180° and 0°, for the SE sequence either phase alternation or a phase of constant 90° corresponding to the CPMG condition are applied. Due to variation of the flip angles α corresponding to the principles of the hyperecho or TRAPS method known from literature (for SE sequences) or TIDE method (for VR sequences), a certain portion of the magnetization will be present as z-magnetization and will relax in accordance with the relaxation time T1, i.e. generally more slowly than with purely transverse decay.

Corresponding to the conventional behavior of the spins for refocused sequences, the signals of all spins will be present, irrespective of their respective resonance frequencies, at time $TE_0=TR/2$ with at least approximately identical signal phases, and for a SE sequence, refocusing will even be complete. It is therefore preferred, but not absolutely necessary, to read out one of the formed signals at this time, i.e. to select TE2 =TR/2 in FIGS. 1 and 2.

Finally, as a third variant, a sequence may be realized, wherein R1 and R2+R3+R4+R5+R6 assume any value. If such a sequence is applied in a periodic scheme, a respective identical refocusing is obtained in every second repetition period (EE sequence) through so-called even echo refocusing. The nominal time of complete coherence is then given by the time at which dephasing caused by R1 is again refocused through R2 or R3.

In a preferred realization, R1=R6=0 and R2=R3/2 (FIG. 2C). The time of complete signal coherence is then $TE_0=0$. Through increasing of the amplitude of R4, the time interval of phase reversal can be reduced to increase efficiency.

In all different variants of signal generation, spins of different metabolites dephase in the time between 2 RF pulses in correspondence with their respective resonance frequencies ω. They are therefore continuously developing in their respective phase corresponding to ω. These signals are read out several times within a TR interval through gradient reversal corresponding to the principle of the EPSI method. With respect to the gradient, the signals are therefore divided into 2 groups of reverse gradient polarity in each case. The type of treatment of these different signals which is preferred in literature consists in separate evaluation of the signals of respective positive and negative read gradients.

As an alternative, the sequence may be implemented such that signals are generated for only one polarity of the read gradient (FIG. 3). Finally, the signals for negative gradient polarity may also be made mathematically coincident with the signals recorded with positive gradient through reversal along the time axis, whereby it must be assured that the zero point in time (echo time) of the two signal groups must be identical. If necessary, the signals have to be corrected correspondingly through an EPI correction method disclosed in literature. Otherwise, so-called 180° artefacts may occur.

In a further variant shown in FIG. 4, signal is formed by the principles of even-echo refocusing as in FIG. 2C, but different time intervals TR2 and TR1 are being used, such that the gradient integrals of the respective gradients during TR2 and TR1 are identical in order to effect even echo refocusing, but signal is only created and acquired during TR2, whereas TR1 is kept as short as possible.

To measure M substances with different frequencies $\omega 1, \omega 2, \ldots \omega M$ and different spin densities $\rho 1, \rho 2 \ldots \rho M$ in each case, N signals S1, S2 . . . SN are obtained through implementation with signal read-out at TE1, TE2, . . . TEN read-out times, which each represent a complex superposition of the individual signals which are phase-modulated in accordance with $\omega 1, \omega 2, \ldots \omega M$. The n-th signal $S_n$ thereby produces (with n from 1 . . . M)

$$S_n = \sum_{m=1}^{M} a_m \rho_m \exp(-i\omega(TE_n - TE_0)) \quad [1]$$

$a_m$ is thereby an attenuation factor which reproduces the signal attenuation of each species caused by T1, T2 . . . or through off-resonance (for the VR sequence). $TE_0$ thereby depends on whether the VR, SE or EE sequence is used. $TE_0$ of the VR sequence depends at least in principle also on $\omega$.

For N signals, the above equation [1] produces a system of linear equations which can be solved either explicitly for m<=n (if $a_m$ and m=n are known) or through approximation methods. The contributions ρ1, ρ2 . . . ρm can thereby be calculated from the measured signals. For 3 read-out signals corresponding to FIG. 1, a maximum of 3 substances with different resonance frequencies can be distinguished. TE1 and TE3 are thereby selected with particular preference in such a way that the signals of different metabolites are anti-phased at the read-out times. The time interval TE2−TE1 (or TE3−TE2)=1/(2ω1) is selected to separate two metabolites with the frequencies ω0=0 and ω1.

In general, signals of n metabolites can be separated through reading out n individual signals in each interval TR.

An alternative type of reconstruction of the individual contributions is obtained mainly for a sufficiently large N (n>4 . . . 8) and for use of equidistant read-out times through Fourier transformation. It may also be advantageous for separating a few metabolites, to read out more than n signals to render calculation of individual contributions less susceptible to accidental signal fluctuations.

In the scheme shown in FIG. 1, spatial encoding in the image planes defined by the directions of GR and GP is effected through slice selection by GS. This encoding scheme can be extended in a conventional manner disclosed in literature also through application of further phase encoding gradients In the direction of GS to a method of three-dimensional chemical shift selective imaging or be carried out as unidimensional recording along GR by omitting GP. In any case, the slice selection gradient may also be omitted.

rf characterizes the radio frequency pulses and signals,

GS corresponds to the slice selection gradient, GR to the read gradient and GP to the phase encoding gradient.

S1–S5 relate to gradient lobes used for slice selection, R1–R6 to gradient lobes used for the readout gradient.

An initial excitiation pulse with a preferred flip angle of 90° is applied initially, the phase of which is labelled as φ=0°. After a time interval of TR/2 a series of periodic pulses with flip angle α and phase φ is applied for n2 repetitions during which the phase encoding gradient is varied according to the desired mode of image acquisition. As a consequence of the multiple (in the diagram three) reversals of the readout gradients R2–R6 multiple signals are generated with readout times TE1, TE2, TE3 . . . . Signals are acquired during acquisition intervals TAQ1, TAQ2, TAQ3.

Figure 1:
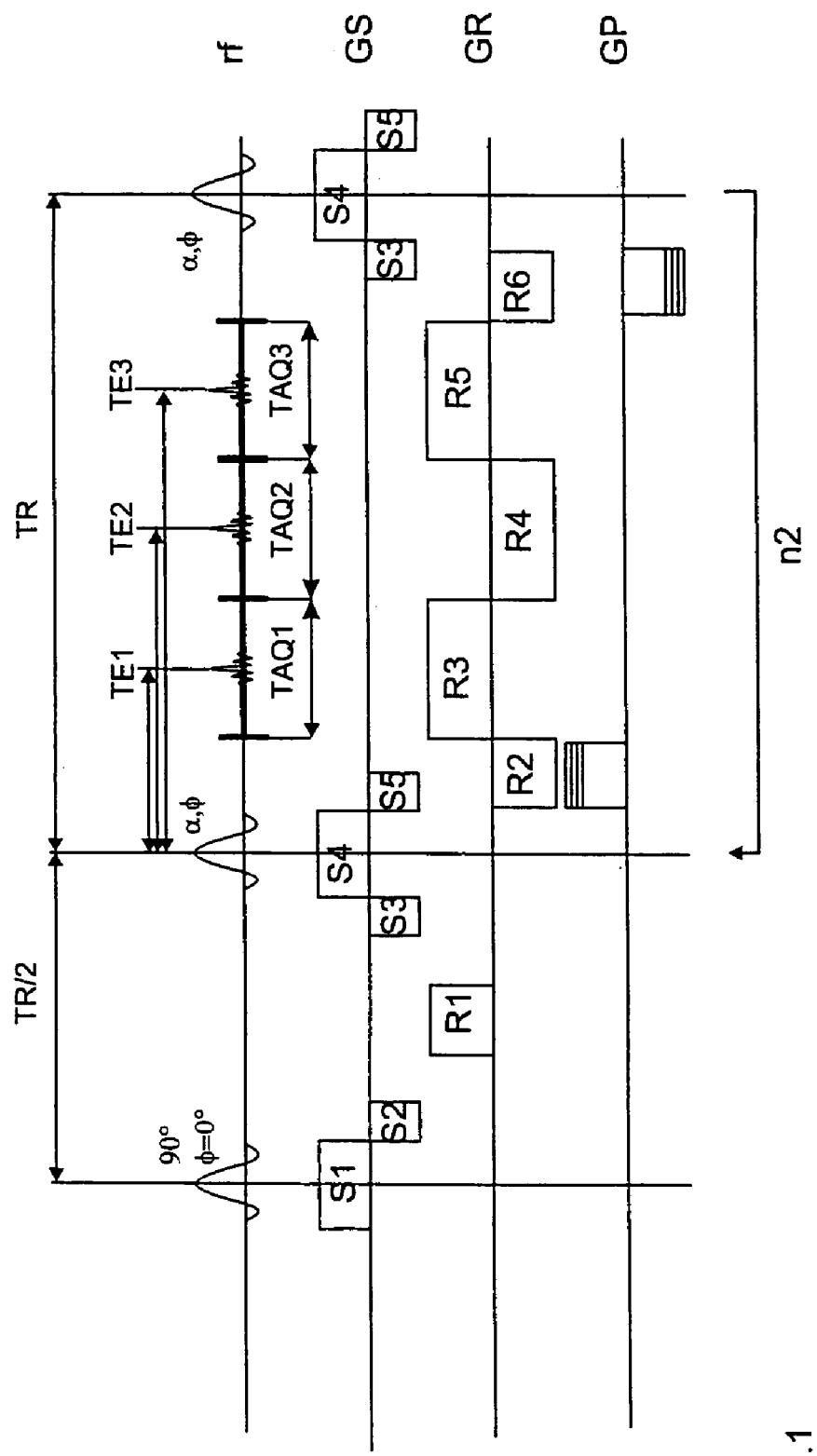
FIG. 1 Diagram of the sequence according to the invention.
Figure 2A:
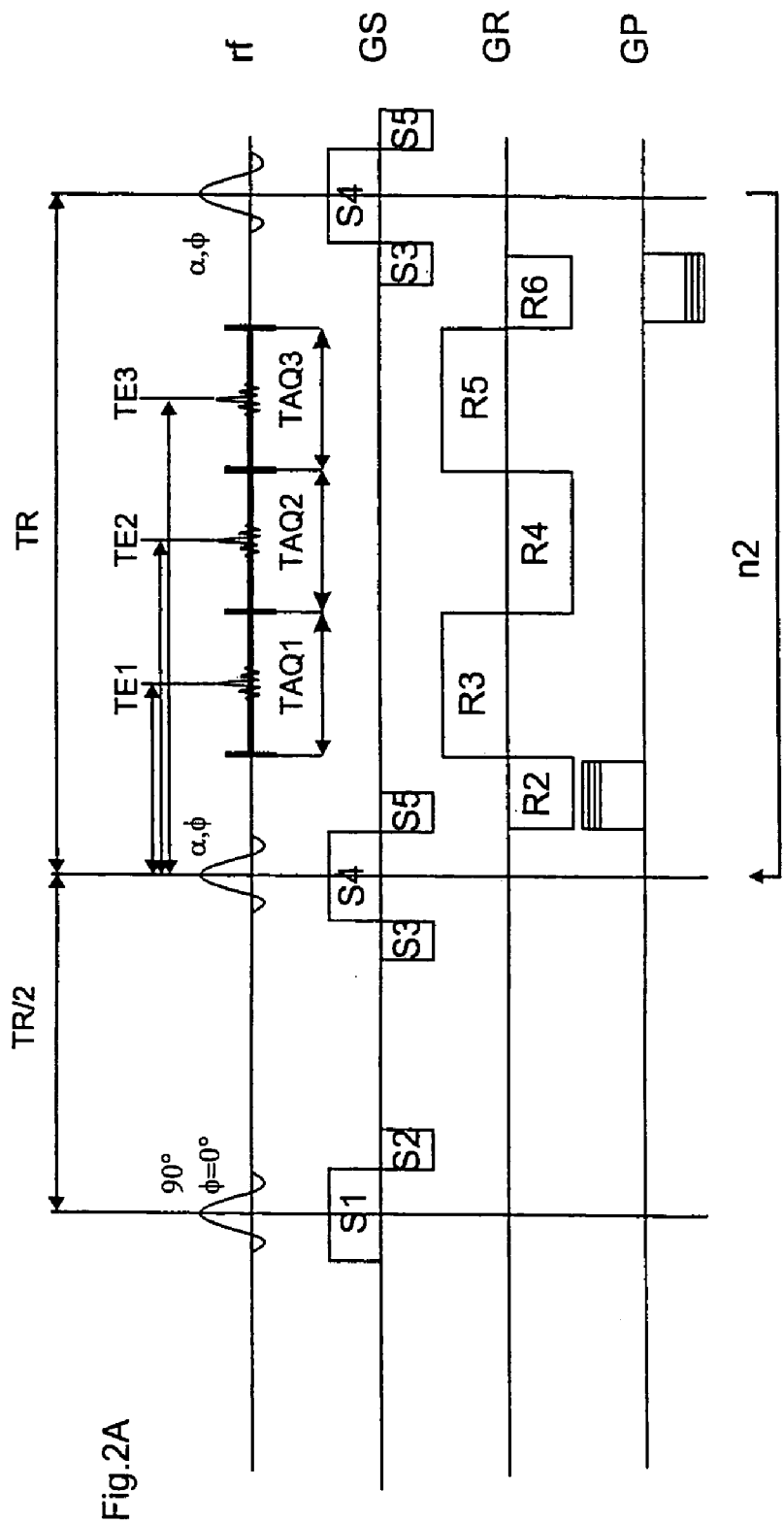

FIG. 2A Variant of the sequence according to the invention, where all gradient lobes are applied such, that the signal is fully refocused at the time of all rf-pulses leading to a fully refocussed sequence.

Figure 2B:
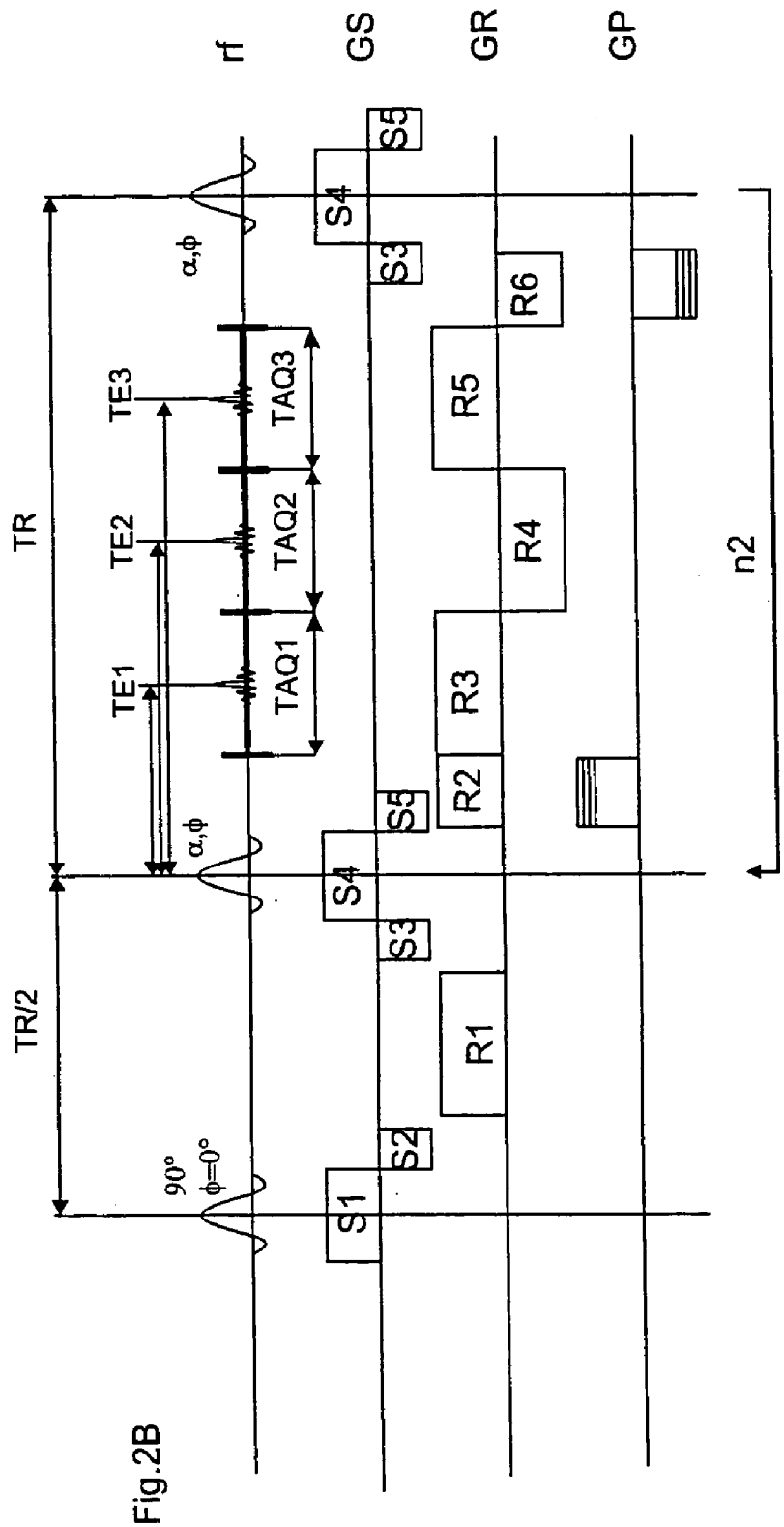

FIG. 2B Variant of the sequence according to the invention, where all gradient lobes are applied such, that the signal is dephased at the time of the refocusing pulses and rephased according to the spin echo mechanism.

Figure 2C:
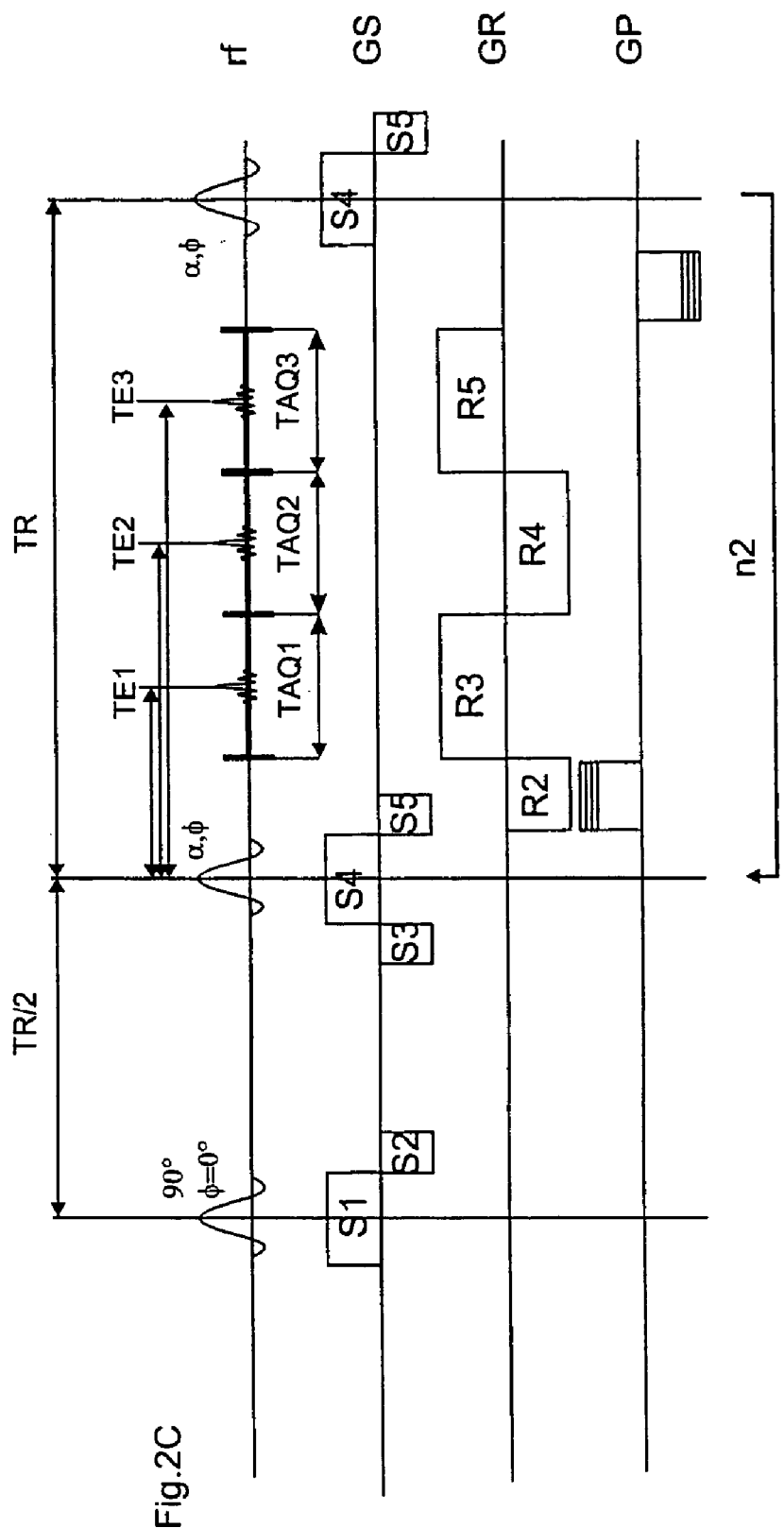

FIG. 2C Variant of the sequence according to the invention, where all gradient lobes are applied such, that signal is formed according to the principles of even echo formation.

Figure 3:
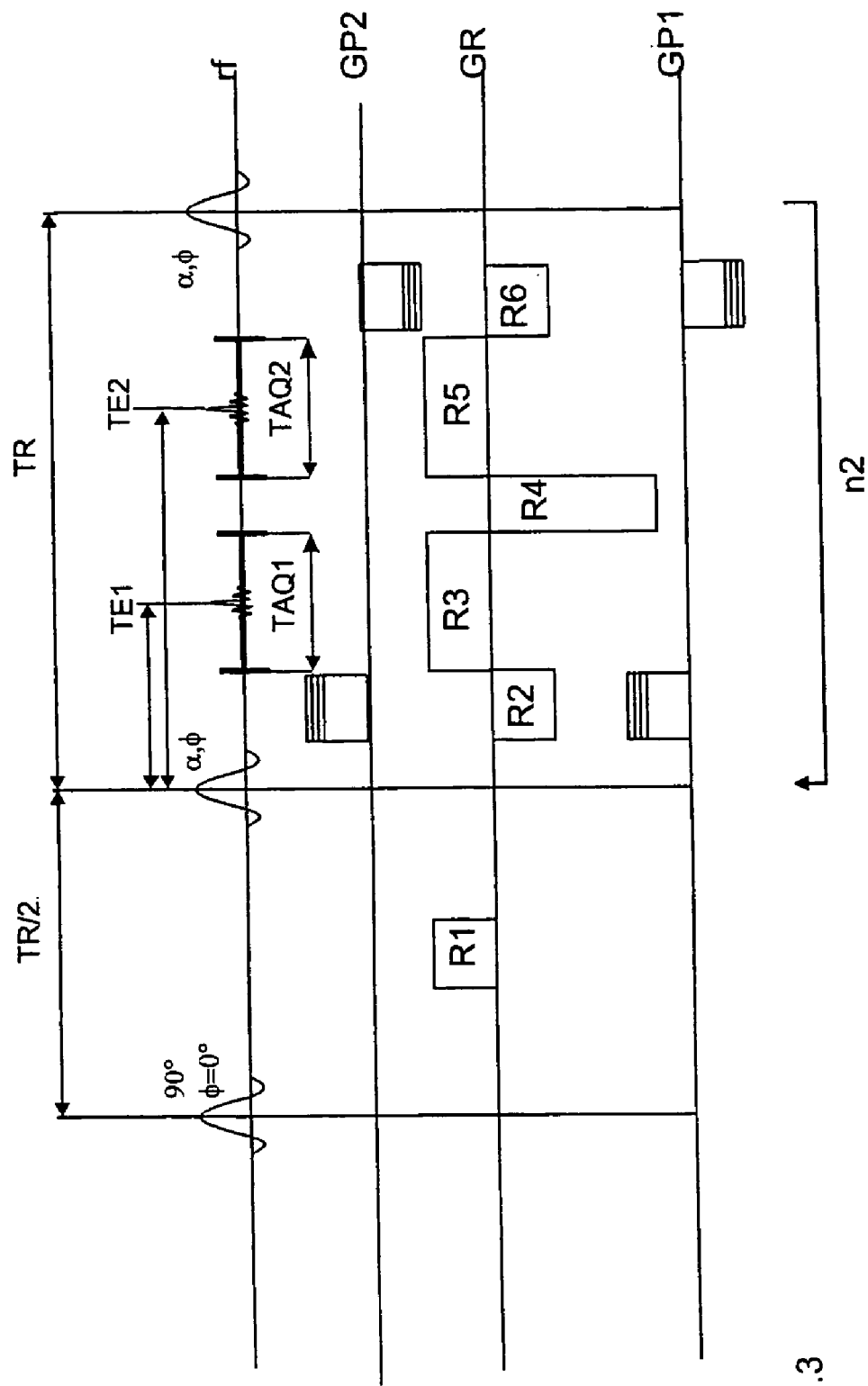

FIG. 3 Variant of the sequence according to the invention, where signal is read out only during readout gradients of identical polarity (R3, R5 . . . ), whereas the even-numbered gradient lobes (R4 . . . ) are chosen to be as short as possible depending on the gradient amplitudes and switching times allowed by the hardware.

Figure 4:
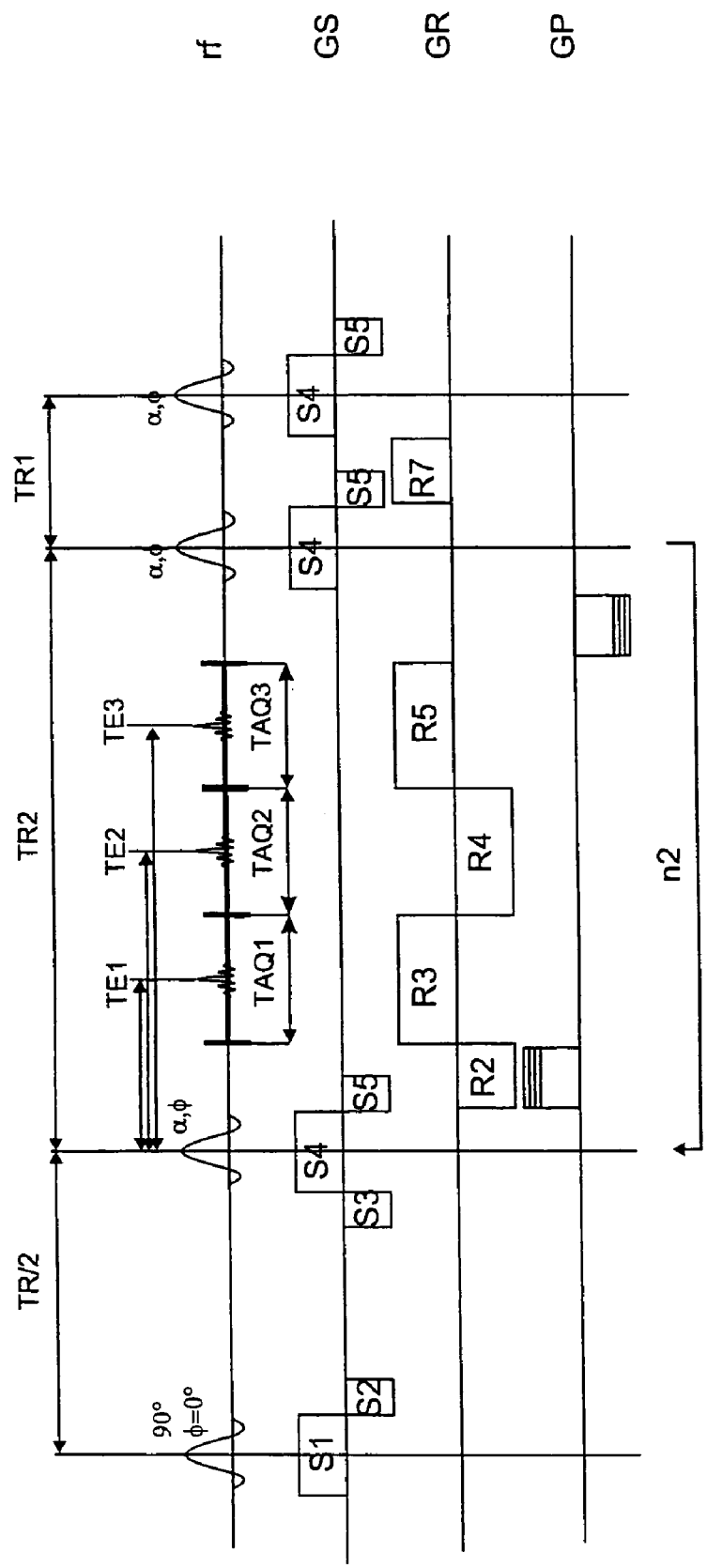

FIG. 4 Variant of the sequence according to FIG. 2C, where different time intervals TR2 and TR1 are used in alternate refocusing intervals TR2=TR/2 corresponds to the timing used in the sequence shown in FIG. 2C, whereas during TR1 gradient lobes are applied such, that their integral over TR1 is identical to the respective gradient integrals during TR2 and TR1 is kept as short as possible.

LITERATURE (1) The basic scheme of a completely refocused sequence is described in Carr H Y, Phys. Rev. 112, 1693 (1958)).

(2) Herzka D A, Kellman P, Aletras A H, Guttman M A; McVeigh E R. Multishot EPI-SSFP in the heart. Magn Reson Med 2002; 47(4):655–664 shows a sequence wherein—similar to the VR sequence—several echoes are read-out in one TR interval. The sequence is, however, used to record non-chemical shift-selective images in that the recorded echoes are each phase-encoded in a different way.

(3) Feinberg, D. A., Kiefer, B. et Litt, A. W.: Dual contrast GRASE (gradient-spin echo) imaging using mixed bandwidth, Magnetic Resonance in Medicine 31, 461–464 (1994) shows analogously thereto a sequence similar to the SE sequence, wherein also in this case, the different echoes are used within one refocusing period to accelerate data recording of an image.

(4) Sarkar S, Heberlein K, Metzger G J, Zhang X, Hu X. Applications of high-resolution echoplanar spectroscopic imaging for structural imaging. J Magn Reson Imaging 1999; 10(1):1–7 shows an EPSI sequence, wherein after excitation many signals are recorded and the signals for different species are obtained with different resonance frequencies through Fourier transformation.

(5) Reeder S B, Wen Z, Yu H, Pineda A R, Gold G E, Markl M, Pelc N J. Multicoil Dixon chemical species separation with an iterative least-squares estimation method. Magn Reson Med 2004; 51(1): 35–45 shows a method wherein signals are sequentially recorded at different TE and the signals of the individual species are obtained therefrom through solution of the resulting system of linear equation.

(6) Feinberg D A, Turner R, Jakab P D, von Kienlin M. Echo-planar imaging with asymmetric gradient modulation and inner-volume excitation. Magn Reson Med 1990; 13(1): 162–169 shows the read-out principle with only one respective polarity of the read gradient.

(7) Hennig J, Weigel M, Scheffler K, Multiecho sequences with variable refocusing Flip Angles: Optimization of Signal Behavior using smooth Transitions between Pseudo Steady States (TRAPS), Magnet Reson Med 49(3):527–535 (2003)

(8) Hennig J, Speck O, Scheffler K, Optimization of the signal behavior in the transition to driven equilibrium in steady state free precession sequences, Magnet Reson Med 48(5): 801–809 (2002)

(9) Hennig J, Scheffler K, Hyperechoes, Magnet Reson Med 46(1): 6–12 (2001)

I claim:

1. Method of nuclear magnetic resonance (NMR) for spatially resolved measurement of the distribution of signals of metabolites of different resonance frequencies by application of a sequence of radio-frequency pulses and switched magnetic fields, wherein the generated signals are generated by application of read gradients in a spatially encoded manner in the direction of these gradients, characterized in that, after a time interval TR/2, the initially excited magnetization is subjected to a sequence of several radio frequency pulses, which are equally spaced by time intervals TR, and the used magnetic field gradients in each TR interval are applied such that the originally excited magnetization is repeatedly refocused in several TR intervals and thereby read-out several times, several signals are generated within one TR interval by multiple inversion of the read gradient, and the signals which are read-out several times are each identically spatially encoded by application of phase encoding gradients and differ therefore only with respect to dephasing given by the respective resonance frequency, such that the individual signals at any read-out time can subsequently be associated with the signal contributions of the examined substances of different resonance frequencies; and gradient integrals within each period defined by the radio frequency pulses which are repeated at an interval TR are constant and unequal to zero, in order that periodic repetition produces refocusing corresponding to the principle of "even-echo refocusing".

2. Method according to claim 1, characterized in that the examined spins are prepared in a state far away from equilibrium magnetization (="hyperpolarization").

3. Method according to claim 1, characterized in that the gradients are applied such that all gradient integrals between successive pulses are zero thereby obtaining complete refocusing.

4. Method according to claim 1, characterized in that the gradient integrals between two radio frequency pulses which are periodically repeated at a separation TR are twice as large, in terms of spin-echo formation, as the integral over the respective gradients between the excitation pulse and the first pulse of the periodic sequence which follows at a separation TR/2.

5. Method according to claim 1, characterized in that a further radio frequency pulse is applied alternatingly with the time interval TR after a shorter time interval TR1, wherein the integral over each of the gradients in the 3 spatial directions is identical with the respective integral during TR thereby reducing the time interval of "even-echo-refocusing".

6. Method according to claim 1, characterized in that in addition to the read gradient, a slice selection gradient is applied in a direction perpendicular thereto, which produces, in connection with radio frequency pulses designed as slice selection pulses, excitation and refocusing of the spins of only one partial volume.

7. Method according to claim 1, characterized in that in a further spatial direction, a phase encoding gradient is applied in correspondence with the method for image encoding in accordance with the two-dimensional Fourier transformation method.

8. Method according to claim 7, characterized in that, in addition to the direction of the slice selection gradient, a further phase encoding gradient is applied which produces spatial encoding of the signals corresponding to the three-dimensional Fourier transformation method.

9. Method according to claim 1, characterized in that spatial encoding is effected in accordance with the principle of filtered back projection.

10. Method according to claim 1, characterized in that spatial encoding is effected in accordance with the principle of spiral imaging.

11. Method according to claim 1, characterized in that the examined spins are prepared in a state far away from equilibrium magnetization (="hyperpolarization") and can therefore be used only once for excitation and the gradient integrals between two radio frequency pulses which are periodically repeated at a separation TR are twice as large, in terms of spin-echo formation, as the integral over the respective gradients between the excitation pulse and the first pulse of the periodic sequence which follows at a separation TR/2.

12. Method according to claim 1, characterized in that the examined spins are prepared in a state far away from equilibrium magnetization (="hyperpolarization") and can therefore be used only once for excitation and a further radio frequency pulse is applied alternatingly with the time interval TR after a shorter time interval TR1, wherein the integral over each of the gradients in the 3 spatial directions is identical with the respective integral during TR thereby reducing the time interval of "even-echo-refocusing".

13. Method according to claim 1, characterized in that the examined spins are prepared in a state far away from equilibrium magnetization (="hyperpolarization") and can therefore be used only once for excitation and in addition to the read gradient, a slice selection gradient is applied in a direction perpendicular thereto, which produces, in connection with radio frequency pulses designed as slice selection pulses, excitation and refocusing of the spins of only one partial volume.

14. Method according to claim 1, characterized in that the examined spins are prepared in a state far away from equilibrium magnetization (="hyperpolarization") and can therefore be used only once for excitation and in addition to the direction of the slice selection gradient, a further phase encoding gradient is applied which produces spatial encoding of the signals corresponding to the three-dimensional Fourier transformation.

15. Method according to claim 1, characterized in that in addition to the read gradient, a slice selection gradient is applied in a direction perpendicular thereto, which produces, in connection with radio frequency pulses designed as slice selection pulses, excitation and refocusing of the spins of only one partial volume and the gradients are applied such that all gradient integrals between successive pulses are zero thereby obtaining complete refocusing.

16. Method according to claim 1, characterized in that in addition to the read gradient, a slice selection gradient is applied in a direction perpendicular thereto, which produces, in connection with radio frequency pulses designed as slice selection pulses, excitation and refocusing of the spins of only one partial volume and the gradient integrals between two radio frequency pulses which are periodically repeated at a separation TR are twice as large, in terms of spin-echo formation, as the integral over the respective gradients between the excitation pulse and the first pulse of the periodic sequence which follows at a separation TR/2.

17. Method according to claim 1, characterized in that in addition to the read gradient, a slice selection gradient is applied in a direction perpendicular thereto, which produces, in connection with radio frequency pulses designed as slice selection pulses, excitation and refocusing of the spins of only one partial volume and the gradient integrals within each period defined by the radio frequency pulses which are repeated at an interval TR are constant and unequal to zero, such that periodic repetition produces refocusing corresponding to the principle of "even-echo refocusing".

18. Method according to claim 1, characterized in that in addition to the read gradient, a slice selection gradient is applied in a direction perpendicular thereto, which produces, in connection with radio frequency pulses designed as slice selection pulses, excitation and refocusing of spins of only one partial volume and a further radio frequency pulse is applied alternatingly with the time interval TR after a shorter time interval TR1, wherein the integral over each of the gradients in the 3 spatial directions is identical with the respective integral during TR thereby reducing the time interval of "even-echo refocusing".

19. Method of nuclear magnetic resonance (NMR) for spatially resolved measurement of the distribution of signals of metabolites of different resonance frequencies by application of a sequence of radio-frequency pulses and switched magnetic fields, wherein the generated signals are generated by application of read gradients in a spatially encoded manner in the direction of these gradients, characterized in that, after a time interval TR/2, the initially excited magnetization is subjected to a sequence of several radio frequency pulses, which are equally spaced by time intervals TR, and the used magnetic field gradients in each TR interval are applied such that the originally excited magnetization is repeatedly refocused in several TR intervals and thereby read-out several times, several signals are aenerated within one TR interval by multiple inversion of the read gradient, and the signals which are read-out several times are each identically spatially encoded by application of phase encoding gradients and differ therefore only with respect to dephasing given by the respective resonance frequency, such that the individual signals at any read-out time can subsequently be associated with the signal contributions of the examined substances of different resonance frequencies, the examined spins are prepared in a state far away from equilibrium magnetization (="hyperpolarization") and the gradients are applied such that all gradient integrals between successive pulses are zero thereby obtaining complete refocusing.

* * * * *